(12) United States Patent
Kang et al.

(10) Patent No.: US 6,233,959 B1
(45) Date of Patent: May 22, 2001

(54) DEHUMIDIFIED COOLING ASSEMBLY FOR IC CHIP MODULES

(75) Inventors: Sukhvinder Kang, Rochester, MN (US); Howard Victor Mahaney, Jr., Cedar Park, TX (US); Roger R. Schmidt; Prabjit Singh, both of Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/415,732

(22) Filed: Oct. 12, 1999

(51) Int. Cl.$^7$ .................................................. F25D 23/12
(52) U.S. Cl. .......................... 62/259.2; 62/3.4; 62/3.2; 62/92
(58) Field of Search .......................... 62/3.4, 3.2, 259.2, 62/93

(56) References Cited

U.S. PATENT DOCUMENTS

| | | | |
|---|---|---|---|
| 5,028,988 | 7/1991 | Porter et al. | 357/81 |
| 5,142,443 | 8/1992 | Moore, Jr. | 361/385 |
| 5,268,812 | 12/1993 | Conte | 361/698 |
| 5,349,823 | 9/1994 | Solomon | 62/6 |
| 5,365,749 | 11/1994 | Porter | 62/259.2 |
| 5,398,775 | * 3/1995 | Rockenfeller et al. | 62/112 |
| 5,404,272 | * 4/1995 | Lebailly et al. | 361/700 |
| 5,463,872 | 11/1995 | Vader et al. | 62/51.1 |
| 5,471,850 | * 12/1995 | Cowans | 62/223 |
| 5,504,924 | 4/1996 | Ohashi et al. | 375/800 |
| 5,740,018 | * 4/1998 | Rumbut, Jr. | 361/720 |
| 5,884,486 | * 3/1999 | Hughes et al. | 62/3.4 |
| 6,009,712 | * 5/2000 | Ito et al. | 62/3.7 |
| 6,055,815 | * 5/2000 | Peterson | 62/3.7 |
| 6,094,919 | * 8/2000 | Bhatia | 62/3.7 |
| 6,116,029 | * 9/2000 | Krawec | 62/3.3 |

* cited by examiner

Primary Examiner—William Doerrler
Assistant Examiner—Mark Shulman
(74) Attorney, Agent, or Firm—Floyd Gonzalez; Cantor Colburn LLP

(57) ABSTRACT

A cooling assembly for an integrated circuit chip module wherein an evaporator-cooled IC module is enclosed within an insulated housing which is surrounded by an atmosphere of dehumidified air.

5 Claims, 2 Drawing Sheets

DEHUMIDIFIED COOLING ASSEMBLY FOR IC CHIP MODULES

BACKGROUND OF THE INVENTION

The present invention relates to cooling technology for electronic packaging for computer systems, and, more particularly, relates to a cooling assembly for lowering the temperature of integrated circuit (IC) chip modules mounted on a printed circuit board (PCB) substrate.

The high circuit densities and operating frequencies in modern integrated circuit devices and multi-chip modules of today's computer systems has resulted in a significant increase in the power dissipated by such chip and module components. No matter how fast one wishes to operate a given electronic circuit chip, there almost always is the potential for running it faster if the chip were to be cooled further and more thermal energy is removed during its operation. This is true of computer processor circuit chips and more particularly of such chips disposed within multi-chip modules that generate significant amounts of heat. Because of the demand to run processor modules at increasingly higher speeds, the clock frequencies at which the devices must operate also increases. Power generation correspondingly rises in proportion to the clock frequency, generating thermal demands in terms of energy which must be removed for faster, safer, and more reliable circuit operation. It is required that cooling arrangements be provided so that the heat generated by the operation of these components be effectively and efficiently removed in order to maintain the temperature of the devices within the limits that will keep the operating parameters of the devices in a predetermined range, and, further, to prevent the damage or destruction of the integrated circuit devices by overheating from the high temperatures generated.

Using refrigeration technology, integrated circuit chips and multi-chip modules readily can be cooled to appropriately low temperatures. In addition, however, to the necessity of cooling to prevent damage from overheating, it is also recognized that cooling offers marked advantages in circuit speed, system throughput, and component reliability. With the advent of CMOS processors for computers, the potential performance improvements obtained by lowering chip temperature are intriguing. It is known that a CMOS circuit is capable of operating at higher clock speeds as the circuit temperature is lowered. Current CMOS chip circuit designs generally perform about two percent faster for each 10° C. the chip temperature is lowered. Accordingly, it would not be unreasonable to achieve a 100° C. reduction in chip temperature with refrigeration techniques as compared to cooling with ambient air, thus achieving a 20% performance improvement. It has been reported that the processor frequency of a CMOS processor has been improved by nearly threefold by cooling the processor to temperatures around –200° C.

Various techniques for the cooling of integrated circuit electronic devices are known and many have been implemented with success. Some practiced techniques involve conventional methods such as by directing ambient air onto the components to be cooled; by sealing the computer cabinet and refrigerating the interior of the cabinet; as well as by immersing components in coolants such as liquid nitrogen. Individual integrated chip or multi-chip module components also have been cooled through specialized devices such as hollow cold plates which are attached to the components to be cooled. Liquid coolants can be circulated through the hollow cold plates to effect cooling of the attached components.

However, in order to take practical advantage of the performance improvements achievable by lowering integrated chip temperatures to levels, for example, in the range of –40° C. to –60° C., many engineering problems must be addressed. In addition to issues involving refrigeration system design, evaporator design, and thermal controls, cooling of the electronic components to a temperature below the ambient environment dew point results in condensation problems in that moisture will condense on the cooled components and on the structures and components to which the cooled components may be attached. This condensation can damage and literally destroy the electronic circuitry associated with the integrated chip or multi-chip module and the circuit board on which it is mounted.

Accordingly, a cooling system is needed for an integrated chip or multi-chip module device which effectively and efficiently can reduce the temperature of the device to below ambient dew point without causing condensation damage to the device or contiguous components or circuitry.

SUMMARY OF THE INVENTION

Now, an improved assembly for cooling an integrated circuit (IC) device mounted on a printed circuit board (PCB) within a computer system has been developed whereby cooling of the IC device is efficiently and effectively accomplished while damaging condensation is controlled from forming on the cooled devices as well as the PCB on which the IC device is mounted and other electrical components contiguous to the cooled device. According to the present invention, a cooling assembly is provided which comprises an evaporator unit attached to the top of the hat, or cover, of an integrated chip module and in thermal communication with the hat surface. In order to maintain the reduced temperature of the cooled device and isolate the device from the ambient warm environment, the IC module and attached cooling evaporator unit are enclosed within an insulated housing which fully envelops the device and evaporator and is itself bonded around its bottom peripheral edge to the surface of the printed circuit board around the outer perimeter of the module to board interface. The housing includes walls fabricated from thermal insulating material. Such material comprises rigid structural foam such as polyurethane foam, expanded expanded polystyrene, and the like, in order to provide structural integrity as well as a thermal insulative barrier. Typically, such structural foams feature thermal conductivities ranging from about 0.04 to about 0.12 W/m.° K. The preferred insulating material is rigid polyurethane foam. While it is critical to cool the IC module to low temperatures, typically in the range of about –40° C. to about –60° C., cooling to such temperatures below ambient dew point presents potential condensation problems on the cooled component as well as structures and other components attached to and around the cooled component. The described insulation helps to isolate the cooled module from the surrounding environment, but, at the low temperatures to which the module is cooled, the outer surface of the insulated enclosure may still get cool enough to result in condensation. Accordingly, in order to reduce the dew point around the insulated enclosure and thus avoid condensation on the cooled module housing and the PCB which it is attached, pursuant to the present invention, a low humidity atmosphere is provided around the housing. This low humidity atmosphere is provided by surrounding the module housing with an enclosure cover, through which a flow or atmosphere of dehumidified air is maintained. This most readily can be accomplished by introducing a low air flowrate stream through an inlet conduit in flow communication with the interior airspace of the enclosure, and providing an exhaust outlet at a remote position on the enclosure and in flow communication with the interior of the enclosure, so that the flow of air can exit the airspace within the enclosure (a flow rate of about 0.05 to 0.1 m/s through exhaust paths greater than 3 mm long has been shown to be effective). The incoming air can be provided by any air moving device, such as a fan or a blower. Depending on the flowrate of the introduced dry air and the integrity of the enclosure seal around the module housing, provision of a designated exhaust outlet might not be required, as existing leakage through the cover seals might suffice as an exhaust outlet. A feature of the present invention is that it can be designed to utilize existing components that are integral to the basic arrangement of a refrigerated component system.

The refrigeration unit used in conjunction with an evaporator-cooled IC module typically includes a compressor, condenser, and expansion device connected in a closed refrigeration loop with the coolant flow passages in the evaporator thermal block. The coolant used may be any coolant fluid; R134A and R507, standard refrigerants known and used in the art, are preferred because of their environmentally friendly composition.

In a preferred embodiment of the present invention, a portion of the coolant capillary tube that serves as the expansion device in the refrigeration circuit is wrapped around the inlet conduit through which air flows into the enclosure covering the module housing. This setup takes advantage of the fact that as the refrigeration coolant passes through the capillary tube, the temperature decreases from a high temperature at the outlet of the condenser to a very low temperature at the inlet of the evaporator. By wrapping a portion of the capillary tube around the inlet conduit delivering low flowrate air into the airspace around the enclosed module, moisture in the air flowing through the inlet conduit will condense on the walls of the chilled conduit. The extent to which the capillary tube is wrapped around the inlet conduit is determined by the degree necessary to condense the air moisture, but not such that temperatures within the conduit fall below freezing, since ice then would build up and potentially block the airflow in the conduit. Condensate so formed readily can be drained from the inlet conduit, for example, by providing a trap with a drain in the inlet conduit at a point before the conduit meets the enclosure cover. Once again, utilizing existing integral components in the refrigeration system, a tube can be connected to the drain in the inlet conduit, leading to a receptacle such as a drip pan. To remove any collected water in the drip pan receptacle, the hot discharge piping from the outlet of the compressor can be routed through the drip pan. This hot piping serves to evaporate any condensate in the drip pan receptacle and prevent any build-up of fluid.

By providing a dehumidified atmosphere around the module housing, it should be able to eliminate the use of heating elements to warm areas of the PCB in contact with the cooled module, as well as to reduce the amount of insulation utilized in the walls of the module housing. Accordingly, use of the present dehumidified enclosure might not require any additional space on the printed circuit board.

The above-discussed and other features and advantages of the present invention will be appreciated and understood by those skilled in the art from the following detailed description and drawings.

BRIEF DESCRIPTION OF THE DRAWINGS

Referring now to the drawings in which like elements are numbered above in the several Figures.

DETAILED DESCRIPTION OF THE INVENTION

Figure 1:
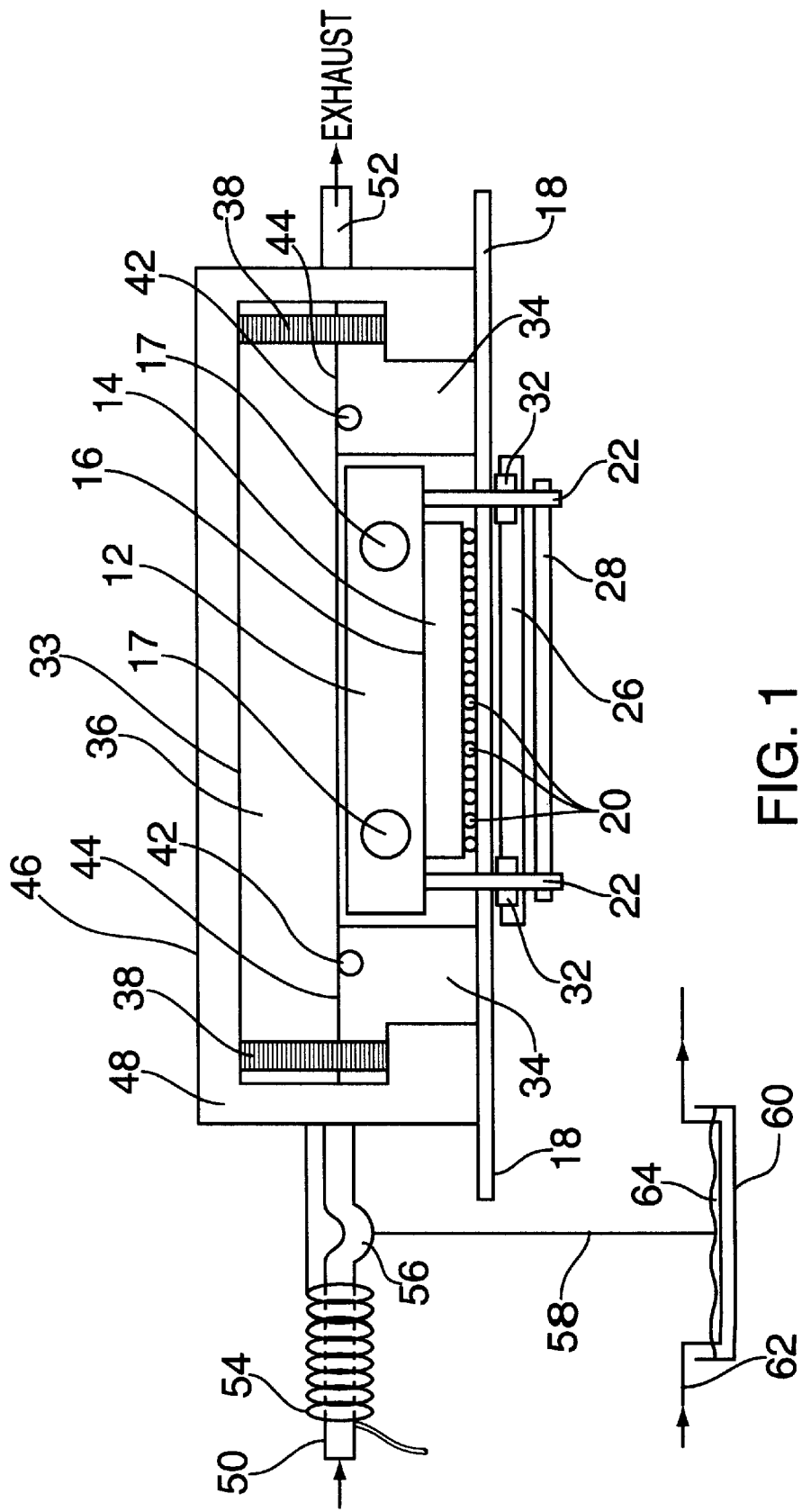
FIG. 1 is a simplified cross sectional side view illustrating an enclosed evaporator-cooled IC module within a dehumidified air atmosphere, pursuant to the present invention.

Referring to FIG. 1, an IC module cooling assembly is shown comprising an evaporator unit 12, which is a thermal block of aluminum or copper, mounted on top of the hat, or cover, of an integrated circuit chip module 14, forming a thermal interface through conductive grease layer 16. In operation, coolant fluid from a refrigeration unit (not shown) is circulated through serpentine passages 17, bored or drilled into evaporator block 12, in a predetermined pattern. IC module 14 is in electrical communication with printed circuit board 18 via solder ball interconnects 20. The evaporator unit 12 is attached to the printed circuit board 18 by bolts 22, around its periphery, which extend from evaporator 12 and pass through printed circuit board 18 and are threaded into stiffener member 26, which serves to reinforce and stiffen the printed circuit board to prevent it from flexing under the stress of the mounted cooling assembly, and finally threaded into steel spring plate 28. Rubber O-rings 32 seal around the mounting bolts and help to prevent air leakage into the assembly. In order to insulate the IC module 14 from the warm ambient surroundings, the evaporator-cooled module 14 is fully enclosed within an insulated housing 33 comprising a base member 34 and lid 36. Base 34 is made of a rigid polyurethane foam material, which preferably is formed by being molded to the appropriate shape. The bottom of housing base member 34 is bonded to the surface of the printed circuit board 18 through a suitable adhesive (not shown). The lid 36, which is separate and removable from base 34 in order to provide service access to IC module 14, also is made from a rigid polyurethane foam and is attached to the base by threaded connectors 38. To ensure an airtight seal between the lid 36 and base 34, an O-ring 42 is set around the interface of the lid 36 and base 34, along with a layer of grease 44.

Cooling of the IC module to typical temperatures in the range of −40 to −60° C. readily could introduce condensation problems on the outer surface of the insulated housing, as well as other structures and electrical components which are nearby or to which the IC module is attached. Accordingly, it is desirable to maintain the inside of the housing as cold as possible, while the outside of the housing is maintained warm and dry, above ambient environment dew point.

In order to reduce the dew point around the outside of the insulated housing enclosing evaporator cooled module 14, an enclosure cover 46 is provided to surround the housing 33 around module 14 and create interior airspace 48. A flow of air from a blower or fan (not shown) is introduced to the interior airspace 48 through inlet conduit 50 which is in flow communication with airspace 48. Introduced air fills and flows through airspace 48 and exits the enclosure 46 through exhaust outlet conduit 52. To dehumidify the incoming air through inlet 50, a portion of capillary tube 54, is wrapped around inlet conduit 50. Capillary tube 54 is an integral part of the refrigeration unit (not shown) which provides coolant to the evaporator unit 12 of the IC module cooling assembly. Refrigeration coolant passes through capillary tube 54 from the outlet of the refrigeration unit condenser and then is circulated through the serpentine passages 17 of evaporator unit 12 in order to cool IC module 14. Wrapping the capillary tube 54 around inlet conduit 50 serves to lower the temperature of the air flowing through conduit 50 such that moisture in the incoming air flow will condense on the walls of the cooled conduit 50. The dehumidified air then passes into the interior airspace 48 formed by enclosure 46 around the housing 33 enclosing module 14. Inlet conduit 50 is provided with a condensate trap 56 which serves to collect the condensed moisture from the air flowing through inlet conduit 50. Collected condensate is drained from trap 56 through drainage tube 58 to drip pan receptacle 60. Hot discharge pipe 62 from the outlet of the refrigeration unit compressor (not shown) is routed through the drop pan receptacle 60 and evaporates any collected condensate 64 in the receptacle 60.

Figure 2:
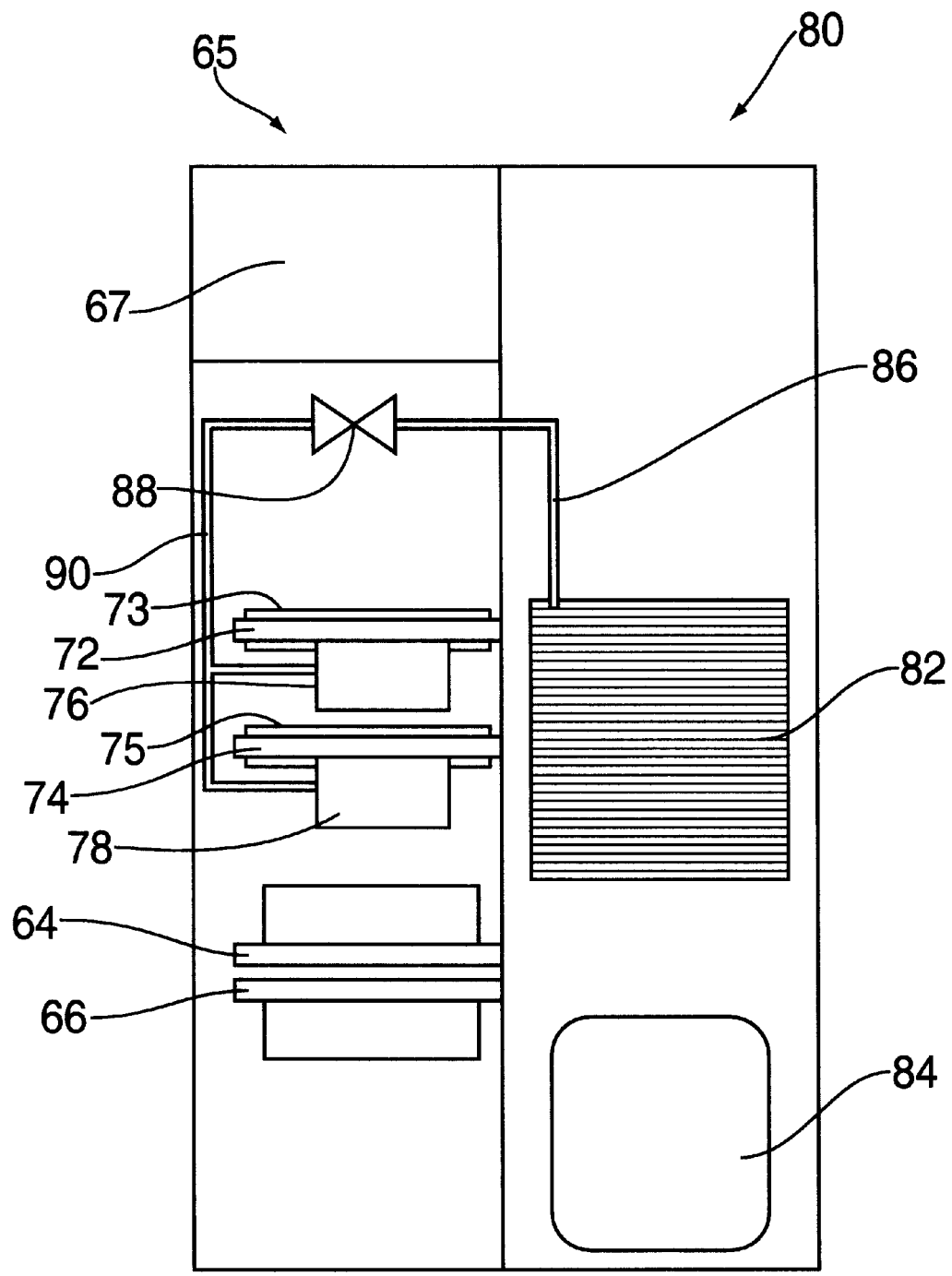
FIG. 2 is a simplified front view of depicting the arrangement of components in a typical workstation processor unit with a sidecar refrigeration system.

FIG. 2 is a simplified front view showing the arrangement of components in a typical computer workstation processor unit 65 wherein one or more integrated circuit chip modules is cooled through a refrigerated evaporator unit. The processor unit 65 consists of a power supply 67, memory cards 64 and 66, to which component modules 68 and 70 are mounted, and processor cards PCB 72 and 74, to which evaporator cooled processor integrated chip modules enclosed within insulated housings 76 and 78 are mounted. PCB cards 72 and 76 are encapsulated by insulated jackets 73 and 75 respectively. Mated next to the processor unit 65 is sidecar refrigeration unit 80 which provides cooling for processor unit 65. Refrigeration unit 80 consists of condenser 82 and compressor 84, interconnected with appropriate hosing and conduits (not shown) and connected through flexible refrigerant line 86 with quick connect coupling 88 to refrigerant distribution hose 90. Distribution hose 90 conducts coolant to the evaporator blocks within insulated housings 76 and 78 to cool the enclosed IC modules.

While the invention has been described with reference to specific embodiments thereof, it is intended that all matter contained in the above description and shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention as defined in the amended claims.

We claim:

1. A cooling assembly for an integrated circuit chip module mounted on a printed circuit board substrate comprising:

an evaporator unit having a thermal interface in thermal communication with said integrated circuit chip module so as to cool said module to a temperature below ambient dew point;

an insulated housing having its base attached to said printed circuit board substrate and surrounding the outer perimeter of said integrated circuit module so as to enclose said evaporator unit and said integrated circuit module;

an enclosure surrounding said insulated housing, said enclosure having an atmosphere of dehumidified air maintained therein;

an inlet conduit in communication with an interior of said enclosure;

an exhaust outlet in communication with said interior of said enclosure; and a capillary tube wrapped around said inlet conduit said capillary tube having coolant circulating therethrough;

wherein a flow of dehumidified air is introduced into said interior of said enclosure through said inlet conduit and said dehumidified air exits said enclosure through said exhaust outlet.

2. The cooling assembly of claim 1 wherein the inlet conduit is cooled to below the dew point of the incoming flow of air, so that moisture in said air is condensed on the walls of said inlet conduit.

3. The cooling assembly of claim 1 wherein the capillary tube is an expansion device between a condenser and the evaporator in a refrigeration circuit used in conjunction with said evaporator unit of the cooling assembly.

4. A cooling assembly for an integrated circuit chip module mounted on a printed circuit board substrate comprising:

an evaporator unit of a refrigeration system having a thermal interface in thermal communication with said integrated circuit chip module so as to cool said module to a temperature below ambient dew point;

an insulated housing having its base attached to said printed circuit board substrate and surrounding the outer perimeter of said integrated circuit module so as to enclose said evaporator unit and said integrated circuit module; and an enclosure surrounding said insulated housing, said enclosure having an inlet conduit and a remote exhaust outlet in flow communication with the interior of said enclosure;

an air moving device to introduce a flow of dehumidified air through said inlet conduit and through the enclosure to exit said exhaust outlet, said inlet conduit wrapped with a coolant chilled capillary tube from a condenser of the evaporator unit refrigeration system, so as to reduce the temperature of the flow of air to below its dew point to condense moisture from the flow of air before being introduced into said enclosure; and, a drain in said inlet conduit to collect and remove moisture condensed within the conduit.

5. A method for providing a dehumidified air atmosphere for a refrigeration evaporator cooled integrated chip module mounted on a printed circuit board, the method comprising:

circulating a flow of air from an air moving device through an inlet conduit in flow communication with an enclosed space surrounding said integrated chip module;

wrapping a capillary tube around said inlet conduit;

dehumidifying said flow of air before it enters the enclosed space surrounding the module by circulating coolant through said capillary tube and cooling said inlet conduit to below the dew point of the flow of air to condense moisture in said air on the walls of said inlet conduit, and;

collecting and draining the condensed moisture from said inlet conduit.

* * * * *

UNITED STATES PATENT AND TRADEMARK OFFICE
CERTIFICATE OF CORRECTION

PATENT NO. : 6,233,959 B1
DATED : May 22, 2001
INVENTOR(S) : Kang et al.

It is certified that error appears in the above-identified patent and that said Letters Patent is hereby corrected as shown below:

<u>Title page,</u>
Item [56], References Cited, U.S. PATENT DOCUMENTS, delete "5,398,775" and insert therefor -- 5,396,775 --; and after "6,009,712" delete "5/2000" and insert therefor -- 1/2000 --

Signed and Sealed this

Fourth Day of January, 2005

JON W. DUDAS
*Director of the United States Patent and Trademark Office*